(12) United States Patent
Petersen et al.

(10) Patent No.: US 8,907,690 B2
(45) Date of Patent: Dec. 9, 2014

(54) METHOD OF DETERMINING AN ELECTRICAL PROPERTY OF A TEST SAMPLE

(75) Inventors: Dirch H. Petersen, Dyssegard (DK); Ole Hansen, Horsholm (DK)

(73) Assignee: Capres A/S, Lyngby (DK)

( * ) Notice: Subject to any disclaimer, the term of this patent is extended or adjusted under 35 U.S.C. 154(b) by 1068 days.

(21) Appl. No.: 12/676,124

(22) PCT Filed: Sep. 3, 2008

(86) PCT No.: PCT/DK2008/000315
§ 371 (c)(1),
(2), (4) Date: May 25, 2010

(87) PCT Pub. No.: WO2009/030230
PCT Pub. Date: Mar. 12, 2009

(65) Prior Publication Data
US 2010/0271059 A1    Oct. 28, 2010

(30) Foreign Application Priority Data

Sep. 3, 2007 (EP) .................................... 07388066

(51) Int. Cl.
| | |
|---|---|
| G01R 31/20 | (2006.01) |
| G01R 27/08 | (2006.01) |
| G01R 33/06 | (2006.01) |
| G01R 33/00 | (2006.01) |
| H01L 21/66 | (2006.01) |
| G01R 31/26 | (2014.01) |

(52) U.S. Cl.
CPC ............ *H01L 22/14* (2013.01); *G01R 31/2648* (2013.01)
USPC ...... 324/754.03; 324/715; 324/251; 324/261; 324/762.01

(58) Field of Classification Search
CPC .............................. G01R 1/06733; G01R 3/00
USPC .......... 324/750.03, 750.09, 750.19, 765, 251, 324/261, 715, 719, 754.23, 754.01, 754.03
See application file for complete search history.

(56) References Cited

U.S. PATENT DOCUMENTS

| | | | |
|---|---|---|---|
| 3,456,186 A | * | 7/1969 | Bush et al. ..................... 324/715 |
| 4,703,252 A | | 10/1987 | Perloff et al. |

(Continued)

FOREIGN PATENT DOCUMENTS

| | | | |
|---|---|---|---|
| CH | 682017 | 6/1993 | |
| CH | 682017 A5 | * 6/1993 | ............. G01R 1/073 |

(Continued)

OTHER PUBLICATIONS

Translation of CH 682017 A5.*

(Continued)

*Primary Examiner* — Jermele M Hollington
*Assistant Examiner* — Christopher McAndrew
(74) *Attorney, Agent, or Firm* — Klein, O'Neill & Singh, LLP

(57) ABSTRACT

A method of obtaining an electrical property of a test sample, comprising a non-conductive area and a conductive or semi-conductive test area, by performing multiple measurements using a multi-point probe. The method comprising the steps of providing a magnetic field having field lines passing perpendicularly through the test area, bringing the probe into a first position on the test area, the conductive tips of the probe being in contact with the test area, determining a position for each tip relative to the boundary between the non-conductive area and the test area, determining distances between each tip, selecting one tip to be a current source positioned between conductive tips being used for determining a voltage in the test sample, performing a first measurement, moving the probe and performing a second measurement, calculating on the basis of the first and second measurement the electrical property of the test area.

27 Claims, 4 Drawing Sheets

(56) References Cited

U.S. PATENT DOCUMENTS

| | | | |
|---|---|---|---|
| 4,857,839 A * | 8/1989 | Look et al. | 324/754.23 |
| 4,864,227 A * | 9/1989 | Sato | 324/750.19 |
| 5,084,671 A * | 1/1992 | Miyata et al. | 324/750.09 |
| 5,150,042 A * | 9/1992 | Look et al. | 324/754.03 |
| 5,500,589 A * | 3/1996 | Sumcad | 324/202 |
| 5,691,648 A | 11/1997 | Cheng | |
| 5,789,931 A * | 8/1998 | Meyer et al. | 324/762.01 |
| 6,064,202 A * | 5/2000 | Steiner et al. | 324/251 |
| 6,100,704 A * | 8/2000 | Meyer et al. | 324/719 |
| 6,611,142 B1 * | 8/2003 | Jones et al. | 324/261 |
| 6,747,445 B2 | 6/2004 | Fetterman et al. | |
| 6,943,571 B2 | 9/2005 | Worledge | |
| 7,626,377 B2 * | 12/2009 | Kilian et al. | 324/117 H |
| 2001/0017549 A1 * | 8/2001 | Inoue et al. | 324/754 |
| 2004/0183554 A1 | 9/2004 | Worledge | |
| 2005/0052191 A1 * | 3/2005 | Prussin | 324/719 |
| 2005/0062448 A1 | 3/2005 | Oh et al. | |
| 2005/0081609 A1 | 4/2005 | Worledge | |
| 2005/0151552 A1 | 7/2005 | Abraham et al. | |
| 2007/0069760 A1 * | 3/2007 | Lite | 324/765 |

FOREIGN PATENT DOCUMENTS

| | | | |
|---|---|---|---|
| DE | 110981 | 1/1975 | |
| DE | 2726982 | 1/1979 | |
| DE | 4231392 | 3/1994 | |
| JP | 52062479 | 5/1977 | |
| WO | WO94/07262 | 3/1994 | |
| WO | WO 9407262 A1 * | 3/1994 | H01L 21/66 |

OTHER PUBLICATIONS

International Search Report on related PCT application (PCT/DK2008/000315); International Searching Authority (EPO) dated Apr. 12, 2008.

* cited by examiner

METHOD OF DETERMINING AN ELECTRICAL PROPERTY OF A TEST SAMPLE

CROSS-REFERENCE TO RELATED APPLICATION

This application is a national phase filing, under 35 U.S.C. §371(c), of International Application No. PCT/DK2008/000315, filed on Sep. 3, 2008, the entire contents of which are hereby incorporated by reference.

FEDERALLY SPONSORED RESEARCH OR DEVELOPMENT

Not Applicable

BACKGROUND

The present invention relates to a method of determining an electrical property of a test sample. The present invention further relates to a system for determining an electrical property of a test sample.

Related methods and systems may be found in publications such as DE 27 26 982 A1, DE 42 31 392 A1, JP 52 062479, DD 110 981 A1, US 2004/0183554, U.S. Pat. No. 6,943,571, U.S. Pat. No. 4,703,252, U.S. Pat. No. 5,691,648, U.S. Pat. No. 6,747,445, US 2005/0151552, US 2005/0081609 and US 2005/0062448. Reference is made to all of the above-mentioned patent publications, all of which are hereby incorporated in the present specification by reference in their entirety for all purposes.

When performing the method according to the present invention, e.g. by using a system according to the present invention, preferably a probe for testing or determining an electrical property of a test sample is used. The probe may comprise a probe body and a tip supporting part supporting a first plurality of electrical conductive tips. The tip supporting part may extend from the probe body and the probe may further include electrical conductive paths connected to each of the first plurality of electrical conductive tips for establishing electrical contact from a test apparatus to each of the electrical conductive tips. The test apparatus preferably includes a signal generator and a measuring device, such as a current source and a voltage voltmeter.

The base part of the probe is to be attached to, or held or supported by, a probe carrier in a test apparatus, comprising signal generator, detection and/or measuring circuits, display or other output unit for outputting measuring results, input devices for receiving input for controlling measurements, storage medium for storing measurement results and/or communication devices for establishing communication with other devices, such as computers and/or servers, the test apparatus may comprise further devices or units.

The tip supporting part supports a number of tips that are preferably electrically conductive for transmitting and receiving signals to and from the test apparatus through the device or sample that is being tested. The signal may be a RF, HF, DC, AC signal or any other type of electrical signal. The signal is preferably transmitted via the conductive paths from the test apparatus to the test sample or device. Also contact pads may be provided for establishing electrical contact from the test apparatus to the conductive paths on or in the probe.

Also, the tip supporting part may be constituted by a multitude of probe arms each supporting at least one conductive tip. One probe arm may e.g. support two tips while another supports only one. Presently it is preferred that a probe used in the method and/or system according to the present invention has a plurality of probe arms each supporting a single conductive probe tip. The probe may advantageously include 4 or more probe arms, such as 12 probe arms.

SUMMARY

A first aspect of the present invention relates to a method of determining an electrical property of a test sample by utilising the so-called Hall effect, the test sample may comprise a non-conductive area and a test area, the test area being a conductive or semi-conductive area, a boundary or barrier defined between the non-conductive area and the test area, the method may include using a test probe comprising a probe body having a planar probe surface and a first multitude of probe arms extending from the probe body parallel to the planar probe surface, the probe further comprising a first multitude electrical conductive tips each supported by a respective probe arm, the electrical conductive tips adapted to establish electrical contact to the test area. The method may comprise the steps of:

providing a magnetic field having field lines passing perpendicularly through the test area, bringing the probe into a first position on the test area, the first multitude of electrical conductive tips being in contact with the test area, determining the distance between each of the first multitude of electrical conductive tips and the boundary, determining distances between each of the first multitude of electrical conductive tips, selecting one electrical conductive tip to be a current source, the one electrical conductive tip being chosen so that the one electrical conductive tip is positioned between a first and a second electrical conductive tip being used for determining a voltage in the test sample, performing a series of measurements where the ratio between the distance of the one electrical conductive tip and the boundary and the distance between the first and the second electrical conductive tip are varied, calculating on the basis of the series of measurements an electrical property of the conductive test area.

The test area is preferably formed as a thin film on or in a substrate. Examples include semi-conducting thin films n-type or p-type, metallic thin films, conductive or semi-conductive polymer thin film, SI, SiGe, Ge, GeAs, TaN, Cu, NiSi, TiSi, CoSi, NiGe, silicides, germanides or combinations thereof.

Although non-conductive areas are mentioned, the area outside the test area may have some mostly negligible conductivity. In the real world, it is almost impossible to ensure that atoms from the conductive or semi-conductive area, i.e. the test area, do not migrate, diffuse or in other ways are mixed with the material in the supporting body, i.e. the non-conductive area.

In an actual, physical, embodiment the boundary or barrier mentioned above may not be sharply defined in a mathematical sense, but is still considered within the scope of the present invention.

The magnetic field is preferably oriented so that a large part of the magnetic field lines are perpendicular or normal relative to the test area. The magnetic field lines may be oriented going into or away from the test area. The magnetic field may have a general orientation not perpendicular or normal to the surface of the test sample. However, it is contemplated that only the component of the magnetic field being perpendicular to the test sample surface will provide the desired effect. Therefore it is contemplated to give the maximum effect when the magnetic field is generally oriented perpendicular or normal to the surface of the test sample.

The test probe may be of a kind such as disclosed in EP 1 095 282 and US 2004/0056674. The probe used may have equidistant distances between the probe tips or have varying distances, i.e. one distance between two neighbouring probe tips or arms and another distance between two other neighbouring probe tips or arms. The probe used may include a multitude of probe arms. In specific alternative embodiments multiple probes may be used for obtaining different measurements at different distances from a boundary. Also, multiple probes may be used for establishing current source, current drain and two voltage measuring points.

The probe is preferably made from a non-conductive material and includes electrical conductive tips supported by a probe arm extending from the probe body. Electrical conductive paths may be formed on or in the probe and probe arms for establishing electrical contact from a test apparatus through the probe and to the test area. Initially the test probe is received in some kind of test probe holder, e.g. on a movable arm, and the test sample is received in a test sample holder, e.g. a fixed or movable arm, so that the test probe and the test sample are movable relative to each other.

The test probe is then brought into contact with the test sample so that the probe arms establish contact with the test sample surface. As will be disclosed below a series of measurements is then performed so that the measured data may be used to calculate one or more electrical properties of the test sample. The dataset is obtained by varying the distance between the probe arms and the boundary on the test sample between the test area and the surrounding, non-conductive, area. The distance may, but is not limited to, be calculated as the most direct or shortest or Euclidian distance from a point to a line representing the boundary.

Advantageously the series of measurements may be constituted by measurements performed at a number of non-identical positions. The test probe may be moved to different locations, where different measurements may be performed. E.g. the probe may be moved stepwise from one location to another location. Alternatively, or in supplement thereto, the series of measurements may be constituted by measurements performed by using different electrical conductive tip as current source for each measurement. As the probe comprises multiple tips, a single one of these probes may be chosen as current source for a given measurement, in the subsequent measurement a different tip may be used as current source, thereby allowing multiple measurements with a single probe position.

Preferably a tip is chosen as a current source so that it is possible to chose two other tips for measuring the voltage so that the voltage measuring tips are located non-symmetrical relative to the current source. This is contemplated to provide the best starting point for the measurements. A probe tip acting as current drain is also selected.

According to the teachings of the present invention the boundary may be linear, rectangular, box-shaped, square, triangular, round, polygonal, arbitrarily shaped, or any combination thereof. Different shapes of the boundary may require different approximations or different number of measurements to obtain an acceptable result. Relatively simple structures such as linear boundaries may require fewer measurements than more complex structures, such as circular geometries. The number of measurements may also depend on the level of precision required in the result.

In the presently preferred embodiment of the present invention the magnetic field is stationary. Advantageously the magnetic field strength is quite high. E.g. the magnetic field may have a field strength in the order of 200 mT-700 mT, such as 400 mT-600 mT, preferably around 500 mT. Comparatively the earths magnetic field is in the order of ~0.05 mT.

In an advantageous embodiment of the present invention the first multitude of probe tips may be positioned on a line. Further, during the measurements the probe may be oriented so that the probe tips are positioned parallel to a part of the boundary. If the probe is moved during the measurements the probe may then e.g. be stepwise moved away or towards the boundary. In an alternative embodiment during the measurements the probe may be oriented so that the probe tips are positioned non-parallel to a part of the boundary. Further alternatively during the measurements the probe may be oriented so that the probe tips are positioned parallel and non-parallel to a part of the boundary at different times or measurement points.

In an alternative, but equally suitable embodiment of the present invention, the non-identical positions may be reached by moving the probe from one position to another while the electrical conductive tips are in contact with the conductive test area. In one such embodiment the non-identical positions may be reached by moving the probe arms out of contact with the conductive test area and moving the probe relative to the conductive test area before bringing the electrical conductive tips into contact with the conductive test area at the new position. It is contemplated that such an embodiment reduced wear on the test sample and the test probe compared to the above.

According to the basic teachings of the present invention the electrical property determined may include sheet resistance and/or active implant dose and/or carrier mobility.

Most advantageously measurements may be fitted into a data model using a numerical method or an analytical method. The numerical method may be a finite element method or any other suitable method.

The method according to the present invention may further comprise calculating a correction factor or correction function for fitting the measurement to theoretical data. The correction factor or correction function may be used to or for determine any of the above-mentioned electrical properties.

In one particular embodiment of the present invention the test area may define a size or shape allowing the measurements and the calculations to be performed using equations for infinite sheet calculations, which equations will be shown later. If the test area has a sufficiently large diameter relative to the test probe it is contemplated that the test area may be approximated to an infinite sheet. This may also depend on how large a relative error may be acceptable.

A second aspect of the present invention relates to a method of determining an electrical property of a test sample by utilising the so-called Hall effect, the test sample comprising a non-conductive area and a conductive test area, a boundary defined between the non-conductive area and the conductive test area, the method including using a test probe comprising a probe body having a planar probe surface and four probe arms extending from the probe body parallel to the planar probe surface, the probe further comprising four electrical conductive tips each supported by a respective probe arm, the electrical conductive tips adapted to establish electrical contact to the test area. The method may comprise the steps of:

providing a magnetic field being perpendicular to the conductive test area, bringing the probe into a first position on the conductive test area, the four electrical conductive tips being in contact with the conductive test area, determining a position for each of the four electrical conductive tips relative to the boundary, determining distances between each of the four electrical conductive tips, selecting one electrical conductive tip to be a current source, the one electrical conductive tip being chosen so that the one electrical conductive tip positioned between a first and a second electrical conductive tip being used for determining a voltage in the test sample, performing a first measurement by applying a current to the one electrical conductive tip and determining the voltage across the first and a second electrical conductive tips, moving the probe into a second position remote from the first position, performing a second measurement by applying a current to the one electrical conductive tip and determining the voltage across the first and a second electrical conductive tips, calculating on the basis of the first and the second measurement an electrical property of the conductive test area.

A third aspect of the present invention relates to a method of determining an electrical property of a test sample by utilising the so-called Hall effect, the test sample comprising a non-conductive area and a conductive test area, a boundary defined between the non-conductive area and the conductive test area, the method including using a test probe comprising a probe body having a planar probe surface and four probe arms extending from the probe body parallel to the planar probe surface, the probe further comprising four electrical conductive tips each supported by a respective probe arm, the electrical conductive tips adapted to establish electrical contact to the test area. The method may comprise the steps of:

providing a magnetic field being perpendicular to the conductive test area, bringing the probe into a first position on the conductive test area, the four electrical conductive tips being in contact with the conductive test area, determining a position for each of the four electrical conductive tips relative to the boundary, determining distances between each of the four electrical conductive tips, selecting one electrical conductive tip to be a current source, the one electrical conductive tip being chosen so that the one electrical conductive tip positioned between a first and a second electrical conductive tip being used for determining a voltage in the test sample, performing a first measurement by applying a current to the one electrical conductive tip and determining the voltage across the first and a second electrical conductive tips, moving the probe into a second position remote from the first position, performing a second measurement by applying a current to the one electrical conductive tip and determining the voltage across the first and a second electrical conductive tips, calculating on the basis of the first and the second measurement an electrical property of the conductive test area.

The method according to the second and/or third aspect may further include any of the features of the method according to the first aspect.

A fourth aspect of the present invention relates to a system of determining an electrical property of a test sample by utilising the so-called Hall effect, said test sample comprising a non-conductive area and a conductive test area, a boundary defined between said non-conductive area and said conductive test area, said system including:

a test probe comprising a probe body having a planar probe surface and a plurality of probe arms extending from said probe body parallel to said planar probe surface, said probe further comprising a plurality of electrical conductive tips supported by a respective probe arm, said electrical conductive tips adapted to establish electrical contact to said test area, said test probe received in a test probe holder, a test sample holder for receiving and holding said test sample, said test probe holder and said test sample holder being movable relative to each other, a microprocessor system including a software implementation of any of the methods according to the first, second and/or third aspect of the present invention.

Throughout the text the below references are relied on

T. Clarysse, A. Moussa, F. Leys, R. Loo, W. Vandervorst, M. C. Benjamin, R. J. Hillard, V. N. Faifer, M. I. Current, R. Lin, and D. H. Petersen, MRS Spring Meeting 2006, San Francisco, US, 197, (2006). Materials research society, Warrendale, USPA.

D. H. Petersen, R. Lin, T. M. Hansen, E. Rosseel, W. Vandervorst, C. Markvardsen, D. Kjær, and P. F. Nielsen, A comparative study of size dependent four-point probe sheet resistance measurement on laser annealed ultra shallow junctions, reviewed and accepted, to be published in *JVST B*.

T. Clarysse, P. Eyben, B. Parmentier, B. Van Daele, A Satta, Wilfried Vandervorst, R. Lin, D. H. Petersen, and P. F. Nielsen, Advanced carrier depth profiling on Si and Ge with M4PP, reviewed and accepted, to be published in *JVST B*.

C. L. Petersen, R. Lin, D. H. Petersen, and P. F. Nielsen, Micro-scale sheet resistance measurements on Ultra Shallow Junctions, IEEE RTP'06, 2006.

L. J. van der Pauw, Philips Res. Rep. 13, 1 (1958).

M. Shur, Physics of Semiconductor Devices, 1990

J. R. Reitz, F. J. Milford and R. W. Christy, Foundations of Electromagnetic Theory, third edition, 1979.

BRIEF DESCRIPTION OF THE DRAWINGS

The present invention is now to be described with reference to the attached schematic illustrations, in which.

DETAILED DESCRIPTION

Figure 1:
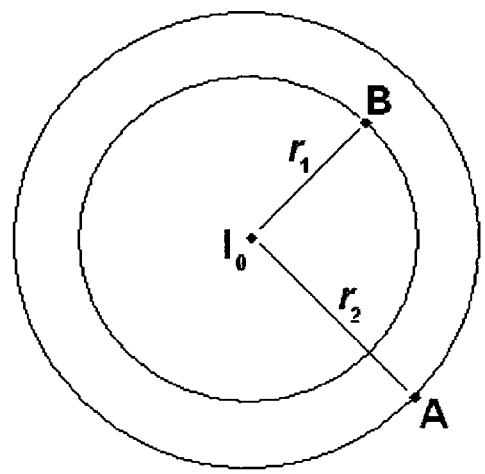
FIG. 1 is a schematic illustration of a current source and two voltage electrodes.

Recently, novel methods for electrical characterization of ultra shallow junctions have become of interest due to increasing complications with fabrication techniques and traditional characterization methods such as conventional four-point probe and SIMS. One such method is micro four-point probe measurements, which enables accurate sheet resistance measurements with high spatial resolution for uniformity control and resistivity (carrier) profiling. The micro four-point probe is insensitive to junction leakage current because of its small size and avoids probe penetration due to the low contact force.

Carrier mobility has for many decades been characterized by the van der Pauw method. However, the method requires a large dedicated test area and significant sample preparation before measurements can be performed. In this paper we demonstrate the use of in-line micro four-point probes for Hall effect measurements on un-patterned (but cleaved) highly doped Ge and Si junctions and on patterned highly doped Ge. We measure the active implant dose and sheet resistance to calculate the carrier mobility.

Hall Effect

When a charge carrier (hole or electron) moves in a magnetic field it is deflected by a magnetic force, $F_m$. The force is given by the Lorentz force law.

$$F_m = q \cdot v \times B \tag{1}$$

where q is the charge, v is the velocity and B is the magnetic field. In steady state Newton's Law for a charge carrier with momentum, p=mv, is then given by $$\frac{dp}{dt} = F - \frac{p}{\tau} = q\left(E + \frac{p}{m} \times B\right) - \frac{p}{\tau} = 0 \tag{2}$$

where $\tau$ is the momentum relaxation time, E is the electric field and m is the effective mass of the charge carrier. Solving (2) with respect to the electric field we find:

$$E = \frac{p}{q\tau} - \frac{1}{m}(p \times B) = \frac{p}{q\tau}\begin{pmatrix} 0 & B_z & -B_y \\ -B_z & 0 & B_x \\ B_y & -B_x & 0 \end{pmatrix}p \tag{3}$$

The momentum relaxation time is related to the low-field mobility as $$\tau = \frac{m\mu}{e} \tag{4}$$

where $\mu$ is the carrier mobility and e is the elementary charge. The average carrier momentum may be written as $$\langle p \rangle = \frac{m}{qn}J \tag{5}$$

where J is the current density. With (4) and (5), (3) reduces to $$E = \begin{pmatrix} \frac{1}{en\mu} & -\frac{B_z}{qn} & \frac{B_y}{qn} \\ \frac{B_z}{qn} & \frac{1}{en\mu} & -\frac{B_x}{qn} \\ -\frac{B_y}{qn} & \frac{B_x}{qn} & \frac{1}{en\mu} \end{pmatrix}J \tag{6}$$

In the special case of a two dimensional current flow in the xy-plane, (6) reduces to $$E = \rho J = \begin{pmatrix} \frac{1}{en\mu} & -\frac{B_z}{qn} \\ \frac{B_z}{qn} & \frac{1}{en\mu} \end{pmatrix}J \tag{7}$$

The resistivity tensor, $\rho$, and conductivity tensor, $\sigma$, are then defined as $$\rho = \begin{pmatrix} \rho_0 & -\rho_H \\ \rho_H & \rho_0 \end{pmatrix} \tag{8}$$

$$\rho_H = \frac{B_z}{qn} \tag{9}$$

$$\rho_0 = \frac{1}{en\mu} \tag{10}$$

$$\sigma = \begin{pmatrix} \frac{\rho_0}{\rho_0^2 + \rho_H^2} & \frac{\rho_H}{\rho_0^2 + \rho_H^2} \\ -\frac{\rho_H}{\rho_0^2 + \rho_H^2} & \frac{\rho_0}{\rho_0^2 + \rho_H^2} \end{pmatrix} = \begin{pmatrix} \sigma_{0,H} & \sigma_H \\ -\sigma_H & \sigma_{0,H} \end{pmatrix} \tag{11}$$

$$\sigma_{0,H} = \frac{\rho_0}{\rho_0^2 + \rho_H^2} = en\mu \frac{1}{1 + \mu^2 B_z^2} \tag{12}$$

$$\sigma_H = \frac{\rho_H}{\rho_0^2 + \rho_H^2} = qn\mu \frac{\mu B_z}{1 + \mu^2 B_z^2} \tag{13}$$

For a static magnetic field the electric field is curl-free and can be expressed as $$E = -\nabla \Phi \tag{14}$$

where $\Phi$ is the electrostatic potential. The current density is divergence free, $\nabla \cdot J = 0$, and by application of Ohm's law (14) reduces to $$\nabla \cdot (\rho E) = -\nabla \cdot (\rho \nabla \Phi) = 0 \tag{15}$$

Equation 15 is then solved with the boundary condition that the current density normal to any boundary is zero.

Hall Effect: Infinite Sheet

If a point current source is positioned on a conductive infinite sheet, the electric field will be purely radial. Otherwise the integral, $\oint E \cdot dl$, around a closed loop at a distance r would be non-zero. Applying a magnetic field does not change this condition. Due to the lack of a boundary where charge can build up, the Lorentz force only causes a rotational current and magnetoresistivity. As the total current passing through a circle with radius, r, centered at the point source will always be $I_0$, the electrostatic potential at a distance r from the point source can be shown to be $$\Phi = \frac{1}{2\pi} \frac{I_0}{\sigma_{0H} t} \ln\frac{r_0}{r} = \frac{1}{2\pi} \frac{I_0 \rho_0}{t} \left(1 + \frac{\rho_H^2}{\rho_0^2}\right) \ln\frac{r_0}{r} \quad (16)$$

where $r_0$ is a reference point for the potential and t is the sheet thickness. The potential difference measured between two voltage electrodes is found as $$\Phi(r_1, r_2) = \Phi(r_2) - \Phi(r_1) \quad (17)$$

where $r_1$ and $r_2$ are the distances from the current source to the voltage electrodes as illustrated in FIG. 1. Equation 16 shows an increase in resistivity due to an applied magnetic field, which is known as the magnetoresistance. The relative resistivity increase is $$\frac{\Delta\rho}{\rho_0} \mu^2 B_z^2 \quad (18)$$

For highly doped Si and Ge and with a magnetic field of 500 mT, the relative resistivity increase is less than 0.3%.

FIG. 1 schematically illustrates a current source and two voltage electrodes on an infinite sheet. The circles illustrate equipotential lines. The potential difference between point A and B is defined in equation 17.

Hall Effect: Half-Plane

If a cut (barrier) through a point current source blocks the circulating current, $J_\theta = 0$, the current becomes purely radial, $J = J_r$. For a cut along the x-axis (y=0) and with the point current source placed at (x,y)=(0,0), the electrostatic potential for the half-plane can then be found as $$\Phi(x, y) = \frac{1}{2\pi} \frac{I_0 \rho_0}{t} \left( \ln\frac{r_0^2}{x^2 + y^2} + 2\frac{\rho_H}{\rho_0} \arcsin\frac{x}{\sqrt{x^2 + y^2}} \right) \quad (19)$$

Note that equation 19 is defined only for (y≥0). If the sample is located at (y≤0) the second term changes sign.

Method of Images

If a current source is placed at a distance from the cut of a half-plane, neither the electric field nor the current will be purely radial. It is well known that the electric field from a point charge near a straight barrier is equal to the electric field of the point charge and a mirror charge without the barrier.

Single Boundary

In the presence of a magnetic field a similar approach can be applied. If we assume a boundary extending along the x-axis (y=0), the electrostatic potential from a point current source positioned (x,y)=(0,d), where d is a positive number, can be expressed as the sum of the unperturbed point current source and a modified image potential that in turn is a sum of two potentials $$\Phi = A_1 \ln\frac{r_0^2}{r_1^2} + A_2 \ln\frac{r_0^2}{r_2^2} + B_2 \arcsin\frac{x}{r_2} \quad (20)$$

$$= A_1 \ln\frac{r_0^2}{x^2 + (y-d)^2} + A_2 \ln\frac{r_0^2}{x^2 + (y+d)^2} + B_2 \arcsin\frac{x}{\sqrt{x^2 + (y+d)^2}}$$

where d is the distance from the current source to the boundary. Subscript 1 refers to the source in real space, while subscript 2 refers to the modified mirror image source in image space.

Figure 2:
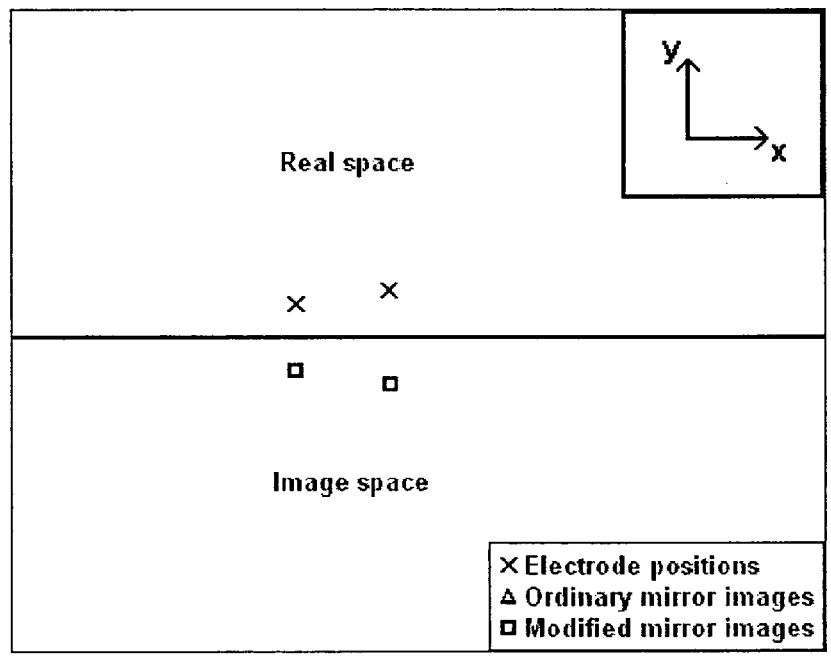
FIG. 2 is a schematic illustration of two current sources placed near a boundary and two modified mirror images in image space.

FIG. 2 schematically Illustrates two current sources placed near a boundary and the two modified mirror images in image space.

As no current flows through the boundary the electrostatic potential from the current source can be shown to be $$\Phi = \frac{1}{4\pi} \frac{I_0 \rho_0}{t} \left( \left(1 + \frac{\rho_H^2}{\rho_0^2}\right) \ln\frac{r_0^2}{x^2 + (y-d)^2} + \left(1 - \frac{\rho_H^2}{\rho_0^2}\right) \ln\frac{r_0^2}{x^2 + (y+d)^2} \right) + \frac{1}{\pi} \frac{I_0 \rho_H}{t} \arcsin\frac{x}{\sqrt{x^2 + (y+d)^2}} \quad (21)$$

Double Boundary

For two boundaries each parallel to the x-axis placed at a distance W between each other such that $(y=Y_{B1})$ and $(y=Y_{B1}+W)$, and with a current source positioned within the boundaries, the electrostatic field will be the sum of the unperturbed point source and two modified image potentials. The modified image potentials also each have an ordinary mirror potential, which is of the same kind as the unperturbed point sources. The exact electrostatic potential turns into an infinite sum of modified and ordinary mirror sources.

$$\Phi = \frac{1}{4\pi} \frac{I_0 \rho_0}{t} \sum_{n=-\infty}^{\infty} \left( \left(1 + \frac{\rho_H^2}{\rho_0^2}\right) \ln\frac{r_0^2}{(x)^2 + (y - Y_I + 2nW)^2} \right) + \quad (22)$$

$$\frac{1}{4\pi} \frac{I_0 \rho_0}{t} \sum_{n=1}^{\infty} \left( \left(1 - \frac{\rho_H^2}{\rho_0^2}\right) \ln\frac{r_0^2}{(x)^2 + (y + Y_{I+} - 2(Y_{B1} + W) + 2nW)^2} \right) +$$

$$\frac{1}{4\pi} \frac{I_0 \rho_0}{t} \sum_{n=1}^{\infty} \left( \left(1 - \frac{\rho_H^2}{\rho_0^2}\right) \ln\frac{r_0^2}{(x)^2 + (y + Y_I - 2Y_{B1} - 2nW)^2} \right) + \frac{1}{\pi}$$

$$\frac{I_0 \rho_H}{t} \sum_{n=1}^{\infty} \left( \arcsin\frac{x}{\sqrt{(x)^2 + (y + Y_I - 2(Y_{B1} + W) + 2nW)^2}} \right) -$$

$$\frac{1}{\pi} \frac{I_0 \rho_H}{t} \sum_{n=1}^{\infty} \left( \arcsin\frac{x}{\sqrt{(x)^2 + (y + Y_I - 2Y_{B1} - 2nW)^2}} \right)$$

Figure 3:
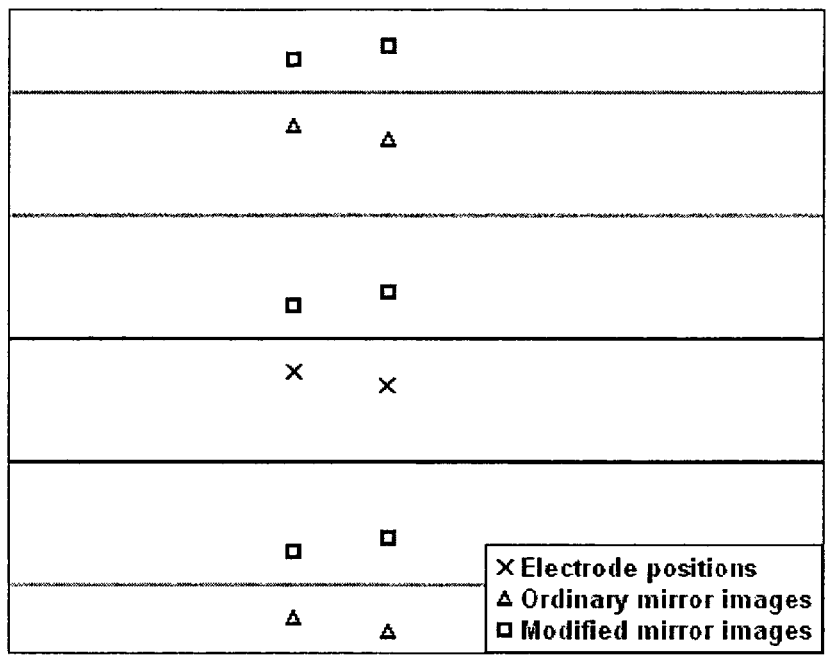
FIG. 3 is a schematic illustration of two current sources placed near two boundaries and the resulting ordinary and modified mirror images in image space.

FIG. 3 schematically illustrates two current sources placed near two boundaries (black lines) and the resulting ordinary and modified mirror images in image space.

Rectangular Test Pad

Figure 4:
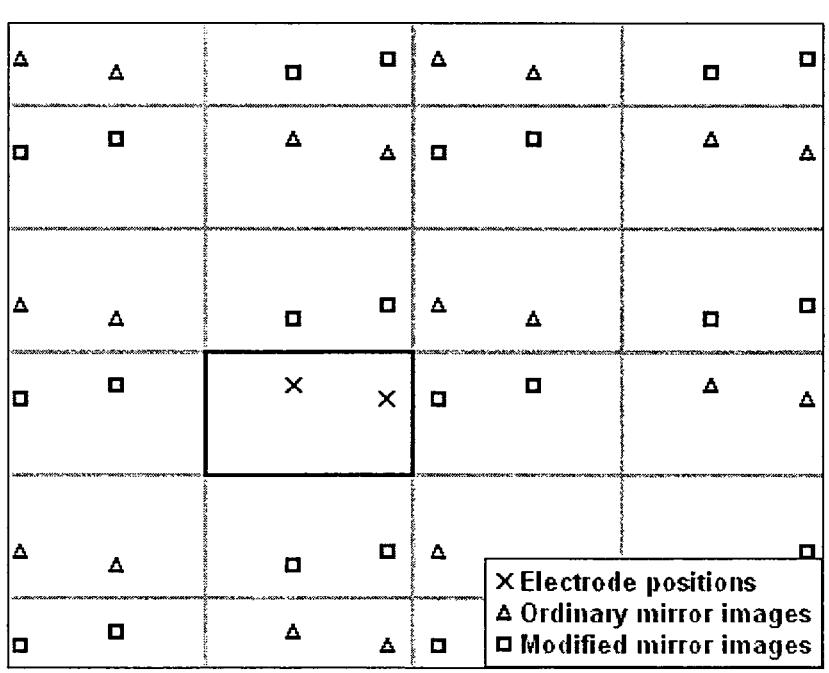
FIG. 4 is a schematic illustration of two current sources placed near four boundaries and the resulting ordinary and modified mirror images in image space.

In the case of a rectangular boundary confining the current with-in a test pad, the electrostatic potential becomes the infinite sum of modified and ordinary image potentials as illustrated in FIG. 4. The solution for a corner is found as the current density becomes zero at this point. Thus, the current source and mirror images must be symmetrically positioned around the corner.

FIG. 4 schematically illustrates two current sources placed near four boundaries forming a rectangle (black lines) and the resulting ordinary and modified mirror images in image space.

Proof of Concept

Figure 5:
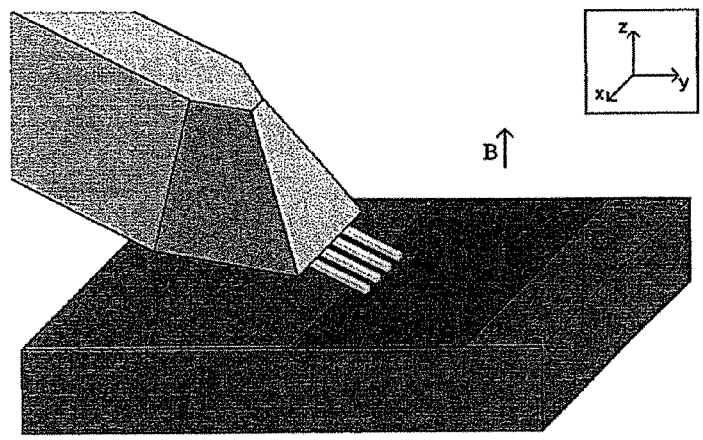
FIG. 5 is a schematic illustration of an experimental setup.

Hall Effect measurements were performed with an equidistant in-line micro four-point probe. The probe was positioned on a p-type Ge thin film collinear to two boundaries and a static magnetic field was applied normal to the thin film as illustrated in FIG. 5. A line scan was performed measuring four-point voltage-current in the two electrode configurations defined in FIGS. 6 and 7.

FIG. 5 schematically illustrates an experimental setup. The four-point probe may be scanned in the y-direction between the two barriers with a scan step of 1 μm.

Figure 6:
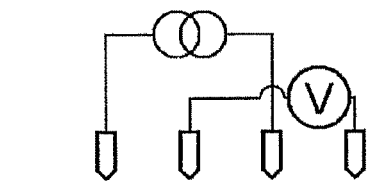
FIGS. 6 and 7 are schematic illustrations of two electrode configurations.
Figure 7:
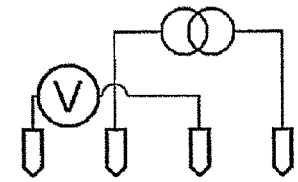

FIGS. 6 and 7 are schematic illustrations of two electrode configurations used for the Hall effect measurement.

The electrostatic potential of a B configuration (FIG. 6) for an equidistant in-line four point probe can be shown to be $$\Phi_B = \frac{1}{4\pi} \frac{I_0 \rho_0}{t} \sum_{n=-\infty}^{\infty} \left( \left(1 + \frac{\rho_H^2}{\rho_0^2}\right) \ln \frac{(3s)^2 + (2nW)^2}{(s)^2 + (2nW)^2} \right) + \quad (23)$$

$$\frac{1}{4\pi} \frac{I_0 \rho_0}{t} \sum_{n=1}^{\infty} \left( \left(1 - \frac{\rho_H^2}{\rho_0^2}\right) \ln \frac{(3s)^2 + (2y + 2(n-1)W)^2}{(s)^2 + (2y + 2(n-1)W)^2} \right) +$$

$$\frac{1}{4\pi} \frac{I_0 \rho_0}{t} \sum_{n=1}^{\infty} \left( \left(1 - \frac{\rho_H^2}{\rho_0^2}\right) \ln \frac{(3s)^2 + (2y - 2nW)^2}{(s)^2 + (2y - 2nW)^2} \right) +$$

$$\frac{3}{\pi} \frac{I_0 \rho_H}{t} \sum_{n=1}^{\infty} \left( \arcsin \frac{s}{\sqrt{(s)^2 + (2y + 2(n-1)W)^2}} \right) -$$

$$\frac{3}{\pi} \frac{I_0 \rho_H}{t} \sum_{n=1}^{\infty} \left( \arcsin \frac{s}{\sqrt{(s)^2 + (2y - 2nW)^2}} \right) -$$

$$\frac{1}{\pi} \frac{I_0 \rho_H}{t} \sum_{n=1}^{\infty} \left( \arcsin \frac{3s}{\sqrt{(3s)^2 + (2y + 2(n-1)W)^2}} \right) +$$

$$\frac{1}{\pi} \frac{I_0 \rho_H}{t} \sum_{n=1}^{\infty} \left( \arcsin \frac{3s}{\sqrt{(3s)^2 + (2y - 2nW)^2}} \right)$$

where s is electrode pitch and the boundaries are placed at (y=0) and (y=W). For the B' configuration shown in FIG. 7, all arcsine terms change sign. Thus, the difference between the two configurations is given by $$\Phi_B - \Phi_{B'} = \frac{6}{\pi} \frac{I_0 \rho_H}{t} \sum_{n=1}^{\infty} \left( \arcsin \frac{s}{\sqrt{(s)^2 + (2y + 2(n-1)W)^2}} \right) - \quad (24)$$

$$\frac{6}{\pi} \frac{I_0 \rho_H}{t} \sum_{n=1}^{\infty} \left( \arcsin \frac{s}{\sqrt{(s)^2 + (2y - 2nW)^2}} \right) -$$

$$\frac{2}{\pi} \frac{I_0 \rho_H}{t} \sum_{n=1}^{\infty} \left( \arcsin \frac{3s}{\sqrt{(3s)^2 + (2y + 2(n-1)W)^2}} \right) +$$

$$\frac{2}{\pi} \frac{I_0 \rho_H}{t} \sum_{n=1}^{\infty} \left( \arcsin \frac{3s}{\sqrt{(3s)^2 + (2y - 2nW)^2}} \right)$$

We define the Hall Resistance as $$R_H = \frac{\Phi_B - \Phi_{B'}}{I_0} \quad (25)$$

And we define the four-point resistance as $$R = \frac{\Phi}{I_0} \quad (26)$$

Figure 8:
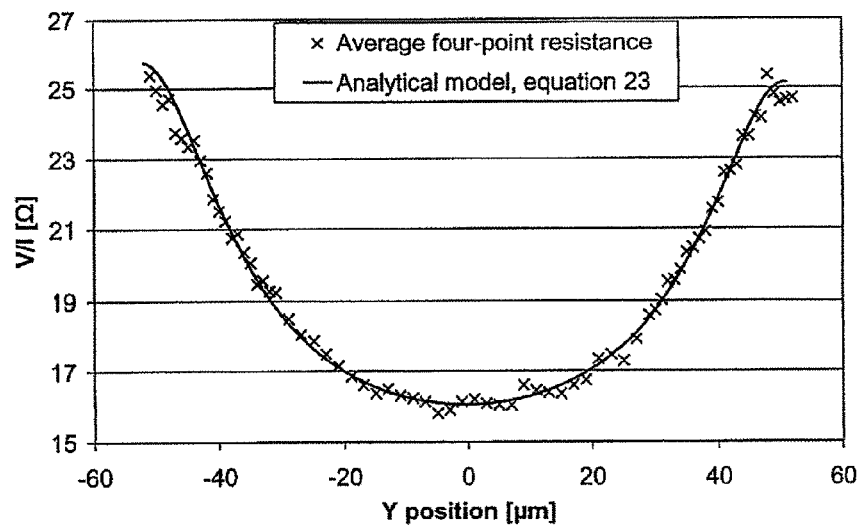
FIG. 8 is a schematic plot of four-point resistance measurement data and an equation.
Figure 9:
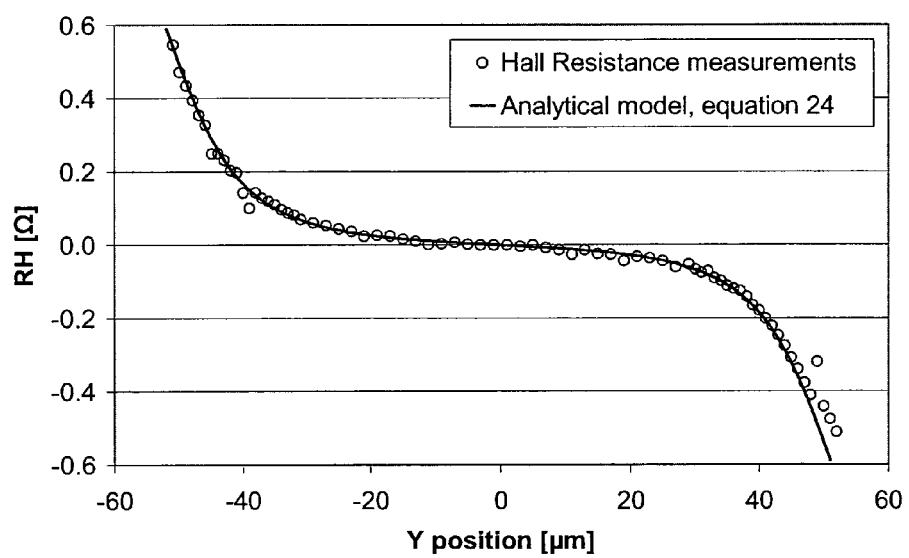
FIG. 9 is a schematic illustration of Hall resistance calculated from measured data and a plot of an equation.

FIG. 8 shows four-point resistance measured on a 100 μm wide line of p-type Ge using configurations B and B' and FIG. 9 shows the calculated Hall Resistance. Equations 23 and 24 have been used to determine the sheet resistance, carrier type, sheet carrier density and carrier mobility.

FIG. 8 schematically illustrates a four-point resistance measurement data and plot of equation 23.

FIG. 9 schematically illustrates Hall resistance calculated from measurement data of FIG. 8 and plot of equation 24.

FEM simulations were performed to confirm the analytical results. While assuming a scattering factor of 1, the sheet resistance, sheet carrier density and carrier mobility have been found and are shown in table 1. Table 1 shows examples of extracted or calculated material properties.

TABLE 1

| Carrier type | p-type |
| --- | --- |
| Sheet resistance | 66.0 Ω/sq |
| Sheet carrier density | $1.06 \times 10^{15}$ cm$^{-2}$ |
| Carrier mobility | 89.4 cm$^2$V$^{-1}$s$^{-1}$ |

The invention claimed is:

1. A method of determining an electrical property of a test sample using the so-called Hall effect, the test sample comprising a non-conductive area and a conductive or semi-conductive test area separated by a boundary, wherein the method comprises:
   providing a test probe comprising a probe body having a planar probe surface, a multitude of probe arms extending from the probe body parallel to the planar probe surface, and a multitude of electrically conductive tips separated by predetermined separation distances, wherein each of the tips is supported by a respective probe arm and is configured to establish electrical contact with the test area, and wherein one of the tips is a current source tip positioned between a first one of the tips and a second one of the tips;
   providing a magnetic field having field lines passing perpendicularly through the test area;
   positioning the test probe so as to place the electrically conductive tips in contact with the test area in a first position;
   determining the shortest distance between the current source tip and the boundary, and between each of the first and second ones of the tips and the boundary;
   applying a first current to the test sample through the current source tip;
   measuring a first voltage between the first and second ones of the electrically conductive tips;
   moving the test probe so as to place the electrically conductive tips in contact with the test area in a second position that changes the ratio of (a) the shortest distance between the current source tip and the boundary to (b) the separation distance between the first and second ones of the electrically conductive tips;
   applying a second current to the test sample through the current source tip;
   measuring a second voltage between the first and second ones of the electrically conductive tips; and calculating, on the basis of the first and second measured voltages, an electrical property of the test area.

2. The method according to claim 1, wherein the boundary has a shape selected from the group consisting of one or more of linear, rectangular, box-shaped, square, triangular, round, polygonal, arbitrarily shaped, and any combination hereof.

3. The method according to claim 1, wherein the magnetic field is stationary.

4. The method according to claim 3, wherein the magnetic field has a field strength in the order of 200 mT-700 mT.

5. The method according to claim 1, wherein the electrically conductive tips in the multitude of electrically conductive tips are arranged linearly.

6. The method according to claim 5, wherein during the steps of measuring, the test probe is oriented so that the electrically conductive tips are positioned parallel to at least a part of the boundary.

7. The method according to claim 1, wherein the step of moving the test probe is performed while maintaining the electrically conductive tips in contact with the test area.

8. The method according to claim 1, wherein the step of moving the test probe is performed by moving the electrically conductive tips out of contact with the test area, moving the test probe, and bringing electrically conductive tips into contact with the test area at the second position.

9. The method according to claim 1, wherein the electrical property is selected from the group consisting of one or more of sheet resistance, active implant dose, and carrier mobility.

10. The method according to claim 1, wherein the first and second measured voltages are fitted into a data model.

11. The method according to claim 1, wherein the method further comprises calculating at least one of a correction factor and a correction function so as to fit the first and second measured voltages to theoretical data.

12. The method according to claim 1, wherein the test area defines a size allowing the measuring steps and the calculating step to be performed using equations for infinite sheet calculations.

13. The method according to claim 1, wherein the method comprises using a numerical method.

14. The method according to claim 1, wherein the magnetic field is a varying magnetic field.

15. The method according to claim 13, wherein the numerical method is a finite element method.

16. A system for determining an electrical property of a test sample using the so-called Hall effect, the test sample comprising a non-conductive area and a conductive or semi-conductive test area separated by a boundary, the system including:
a test probe, comprising: (a) a probe body having a planar probe surface and a plurality of probe arms extending from the probe body parallel to the planar probe surface; and (b) a plurality of electrically conductive tips separated from each other by predetermined separation distances, each of the tips being supported by a respective probe arm and configured to establish electrical contact with the test area;
a test probe holder that receives the test probe, and a test sample holder that receives and holds the test sample, the test probe holder and the test sample holder being movable relative to each other so as to bring the plurality of electrically conductive tips into contact with the test area in a first position and in a second position displaced from the first position;
a magnet configured for providing a magnetic field having field lines passing perpendicularly through the test area;
a current source configured for applying a current to the test sample through a current source tip in the plurality of the electrically conductive tips when the electrically conductive tips are in contact with the test area, the current source tip being one of the electrically conductive tips positioned between first and second tips in the plurality of electrically conductive tips; and
a microprocessor system configured to implement a method comprising the steps of:
(a) determining the shortest distance between the current source tip and the boundary and between each of the first and second tips and the boundary when the electrically conductive tips are in the first position;
(b) measuring a first voltage between the first and second tips of the plurality of electrically conductive tips when the electrically conductive tips are in the first position and a first current is applied to the test sample through the current source tip;
(c) measuring a second voltage between the first and second tips of the plurality of electrically conductive tips when the electrically conductive tips are in the second position and a second current is applied to the test sample through the current source tip, wherein a ratio of (i) the shortest distance between the current source tip and the boundary to (ii) the separation distance between the first and second tips of the plurality of electrically conductive tips when the plurality of electrically conductive tips are in the second position is different from the ratio when the plurality of electrically conductive tips are in the first position; and
(d) calculating, on the basis of the first and second measured voltages, an electrical property of the test area.

17. The system according to claim 16, wherein the magnetic field has a field strength on the order of 200 mT-700 mT.

18. The system according to claim 16, wherein the electrically conductive tips in the plurality of electrically conductive tips are arranged linearly.

19. The system according to claim 18, wherein the electrically conductive tips are positioned parallel to at least a part of the boundary in the first and second positions.

20. The system according to claim 16, wherein the test probe is movable from the first position to the second position while the electrically conductive tips are maintained in contact with the test area.

21. The system according to claim 16, wherein the test probe is movable from the first position to the second position with the electrically conductive tips out of contact with the test area.

22. The system according to claim 16, wherein the electrical property is selected from the group consisting of one or more of sheet resistance, active implant dose, and carrier mobility.

23. The system according to claim 16, wherein the method further comprises fitting the first and second measured voltages into a data model.

24. The system according to claim 16, wherein the method further comprises calculating at least one of a correction factor and a correction function for fitting the first and second measured voltages to theoretical data.

25. The system according to claim 16, wherein the test area defines a size allowing the measuring steps and the calculating step of the method to be performed using equations for infinite sheet calculations.

26. The system according to claim 16, wherein the method comprises using a numerical method.

27. The system according to claim 26, wherein the numerical method is a finite element method.

* * * * *

UNITED STATES PATENT AND TRADEMARK OFFICE
CERTIFICATE OF CORRECTION

PATENT NO. : 8,907,690 B2  Page 1 of 1
APPLICATION NO. : 12/676124
DATED : December 9, 2014
INVENTOR(S) : Dirch H. Petersen et al.

It is certified that error appears in the above-identified patent and that said Letters Patent is hereby corrected as shown below:

In the Specification

In column 7, line 44-46, Delete "$E = \frac{p}{q\tau} - \frac{1}{m}(p \times B) = \frac{p}{q\tau}\begin{pmatrix} 0 & B_z & -B_y \\ -B_z & 0 & B_x \\ B_y & -B_x & 0 \end{pmatrix} p$" and insert -- $\mathbf{E} = \frac{\mathbf{p}}{q\tau} - \frac{1}{m}(\mathbf{p} \times \mathbf{B}) = \frac{\mathbf{p}}{q\tau} - \frac{1}{m}\begin{pmatrix} 0 & B_z & -B_y \\ -B_z & 0 & B_x \\ B_y & -B_x & 0 \end{pmatrix} \mathbf{p}$ --, therefor.

In column 9, line 17-20, Delete "$\frac{\Delta\rho}{\rho_0}\mu^2 B_t^2$" and insert -- $\frac{\Delta\rho}{\rho_0} = \mu^2 B_t^2$ --, therefor.

Signed and Sealed this
Twenty-eighth Day of April, 2015

Michelle K. Lee
*Director of the United States Patent and Trademark Office*